US006879179B2

(12) United States Patent
Fujita

(10) Patent No.: US 6,879,179 B2
(45) Date of Patent: Apr. 12, 2005

(54) IMAGE-SIGNAL SUPPLYING CIRCUIT AND ELECTRO-OPTICAL PANEL

(75) Inventor: Shin Fujita, Fujimi-machi (JP)

(73) Assignee: Seiko Epson Corporation, Tokyo (JP)

(*) Notice: Subject to any disclaimer, the term of this patent is extended or adjusted under 35 U.S.C. 154(b) by 1 day.

(21) Appl. No.: 10/406,259

(22) Filed: Apr. 4, 2003

(65) Prior Publication Data

US 2004/0012552 A1 Jan. 22, 2004

(30) Foreign Application Priority Data

Apr. 16, 2002 (JP) ....................................... 2002-113752

(51) Int. Cl.[7] ........................... G01R 31/26; G01G 3/36
(52) U.S. Cl. ............................ 324/770; 345/87; 345/90
(58) Field of Search ............................ 324/770; 345/87, 345/90

(56) References Cited

U.S. PATENT DOCUMENTS 6,265,889 B1 * 7/2001 Tomita et al. .............. 324/765
6,483,493 B2 * 11/2002 Murade ........................ 345/87
6,703,856 B2 * 3/2004 Fujita ......................... 324/770

* cited by examiner

*Primary Examiner*—Michael Tokar
*Assistant Examiner*—Emily Y Chan
(74) *Attorney, Agent, or Firm*—Oliff & Berridge, PLC

(57) ABSTRACT

The invention provides an image supplying circuit which can inspect for display defects before mounting a data-line driver IC. An image-signal supplying circuit can include wiring for connecting data lines and connection terminals of a data line driver IC, image-signal lines, transfer gates for connecting or disconnecting the wiring and the image-signal lines based on a control signal, control lines, a pull-down resistor connected to the control line, and a pull-up resistor connected to the control line.

8 Claims, 8 Drawing Sheets

IMAGE-SIGNAL SUPPLYING CIRCUIT AND ELECTRO-OPTICAL PANEL

BACKGROUND OF THE INVENTION

1. Field of Invention

The present invention relates to an electro-optical panel including a plurality of scanning lines, a plurality of data lines, and switching elements arranged in a matrix pattern corresponding to intersections of the scanning lines and the data lines, and relates to an image-signal supplying circuit used in the electro-optical panel.

2. Description of Related Art

A known liquid crystal device can include a liquid crystal panel serving as the main part. An active matrix liquid crystal panel includes an element substrate provided with switching elements, which are arranged corresponding to pixel electrodes arranged in a matrix pattern, an opposing substrate provided with a color filter and so on, and liquid crystal filled between the substrates. In this configuration, when a scanning signal is applied to a switching element through a scanning line, that switching element is brought into conduction. In this conduction state, when an image signal is applied to a pixel electrode through a data line, a predetermined charge is accumulated in a liquid crystal layer between the pixel electrode and an opposing electrode (common electrode).

Also, a scanning-line drive circuit that can select a scanning line and a data-line drive circuit that can supply an image signal to a data line may be provided on the element substrate of the liquid crystal panel. Further, instead of providing the data-line drive circuit on the element substrate, the following methods may be used. That is, a driver IC chip, which has been mounted on a film by using a tape automated bonding (TAB) technique, is electrically and mechanically connected through an anisotropic conductive film provided at a predetermined position of the element substrate. Alternatively, the driver IC chip itself is electrically and mechanically connected to a predetermined position of the element substrate through an anisotropic conductive film by using a chip on glass (COG) technique.

FIG. 10 is a block diagram showing a known liquid crystal panel. The liquid crystal panel shown in FIG. 10 includes an image-display region A provided with scanning lines 2 and data lines 3, a COG region B, and a scanning-line drive circuit. Data-line driver IC for driving the data lines are connected to the COG region B by using a COG technique.

In order to display an image in this type of liquid crystal panel, a data-line driver IC must be mounted. Therefore, this liquid crystal panel cannot be inspected for display defects before mounting the data-line driver IC. When the inspection is performed after mounting the data-line driver IC, the entire liquid crystal panel is determined to be defective if the data-line driver IC has a problem, even if the liquid crystal panel without the data-line driver IC is acceptable. As a result, the cost for manufacturing the liquid crystal panel can increase.

The inspection can be performed by providing a pad on each data line and by supplying a signal to the pad through a probe. In this method, however, many pads are necessary if the pitch of the pixels of the liquid crystal panel is small. Accordingly, it is difficult to provide the pads, which is the mechanical limit. In particular, this is a serious problem in a high-definition liquid crystal panel.

SUMMARY OF THE INVENTION

The present invention has been made in view of the above-described problems, and it is an object of the present invention to provide an image-signal supplying circuit which functions as an inspecting circuit for detecting display defects even if the pitch of pixels is small and if a data-line driver IC is not mounted.

In order to solve the above-described problems, an image-signal supplying circuit of the present invention can inspect an electro-optical panel including a plurality of scanning lines, a plurality of data lines, and switching elements arranged in a matrix pattern corresponding to intersections of the scanning lines and the data lines, and supplies an image signal. The image-signal supplying circuit can include wires that connect connection terminals of a data-line driver IC for driving the data lines and the data lines, image-signal lines whose number is smaller than that of the data lines, a connection circuit that connect or disconnects each of the wires and each of the image-signal lines based on a control signal, the connection circuit being provided for each of the wires, and control lines that connect an external connection terminal to which the control signal is supplied and the connection circuits.

According to the present invention, the image-signal lines can be used as inspection-signal lines, and inspection signals are supplied thereto when inspection is performed. Therefore, in the present invention, the image-signal supplying circuit functions as an inspecting circuit and the image-signal lines function as inspection-signal lines. That is, the image-signal supplying circuit according to the present invention functions as both of a signal supplying circuit and an inspecting circuit. By supplying the control signal to the external connection terminal, the data lines can be connected to the image-signal lines. Thus, the data lines can be driven by supplying the inspection signals to the image-signal lines, even if the data-line driver IC is not connected. Furthermore, the number of image-signal lines can be smaller than that of the data lines, and thus the inspection signals can be supplied to the image-signal lines even if the pitch of the data lines is small.

An image-signal supplying circuit of the present invention can inspect an electro-optical panel including a plurality of scanning lines, a plurality of data lines whose number is m wherein. Numbers m and n are natural numbers which are 2 or more, and pixel electrodes and switching elements arranged in a matrix pattern corresponding to intersections of the scanning lines and the data lines. The image-signal supplying circuit can include a selection circuit including multiplexers whose number is n, each multiplexer having an input terminal and output terminals whose number is n, control lines that supply a selection signal to each of the multiplexers, image-signal lines whose number is j, wherein j is a natural number which is 2 or more and is smaller than n. The circuit can also include wires for connecting the input terminals of the multiplexers and connection terminals of a data-line driver IC for driving the data lines, a connection circuit for connecting or disconnecting each of the wires and each of the image-signal lines based on a control signal, the connection circuit being provided for each of the wires, and control lines for connecting an external connection terminal to which the control signal is supplied and the connection circuits.

According to the present invention, the plurality of multiplexers are provided, and thus various patterns can be displayed. In particular, when color filters of a stripe pattern are adopted, monochrome display can be performed by setting m=3 and by connecting a data-line group of each of RGB and the output terminal of the multiplexers. Accordingly, inspection for display defects can be performed for each color.

Preferably, the connection circuit can include a transfer gate which is switched on or switched off by the control signal. Also, the image-signal supplying circuit may include a resistor which is connected between a power source line for supplying a voltage for switching off the transfer gate and the control line. With this configuration, each of the wires and each of the image-signal lines can be reliably disconnected when inspection is not performed.

Preferably, the number of image-signal lines is an even number. With this arrangement, a vertical stripe can be displayed during inspection.

An electro-optical panel of the present invention can include an electro-optical material and further include a plurality of scanning lines, data lines whose number is m·n, wherein m and n are natural numbers which are 2 or more, switching elements arranged in a matrix pattern corresponding to intersections of the scanning lines and the data lines; and the above-described image-signal supplying circuit. In this electro-optical panel, inspection for display defects can be performed before fixing the data-line driver IC to the panel. Therefore, the data-line driver IC is not wasted even if the electro-optical panel is defective. As a result, the cost of the electro-optical panel can be reduced.

Preferably, the electro-optical panel includes a region for providing the data-line driver IC which drives the data lines.

An electronic apparatus of the present invention can include an electro-optical panel in which a data-line driver IC is mounted on a region. The electronic apparatus includes, for example, a liquid crystal device, a view finder used for a video camera, a mobile phone, a notebook computer, a video projector, and the like.

BRIEF DESCRIPTION OF THE DRAWINGS

The invention will be described with reference to the accompanying drawings, wherein like numerals reference like elements, and wherein.

DETAILED DESCRIPTION OF PREFERRED EMBODIMENTS

Hereinafter, embodiments of the present invention will be described with reference to the drawings.

First, a liquid crystal device using liquid crystal as an electro-optical material will be described as an example of the electro-optical device according to the present invention. The liquid crystal device can include a liquid crystal panel AA serving as the main part thereof. The liquid crystal panel AA includes an element substrate provided with thin-film transistors (TFT) serving as switching elements and an opposing substrate. These substrates are bonded to each other such that the electrode-formed surfaces thereof face each other and that a predetermined space exists therebetween. Further, liquid crystal is sandwiched between the substrates.

Figure 1:
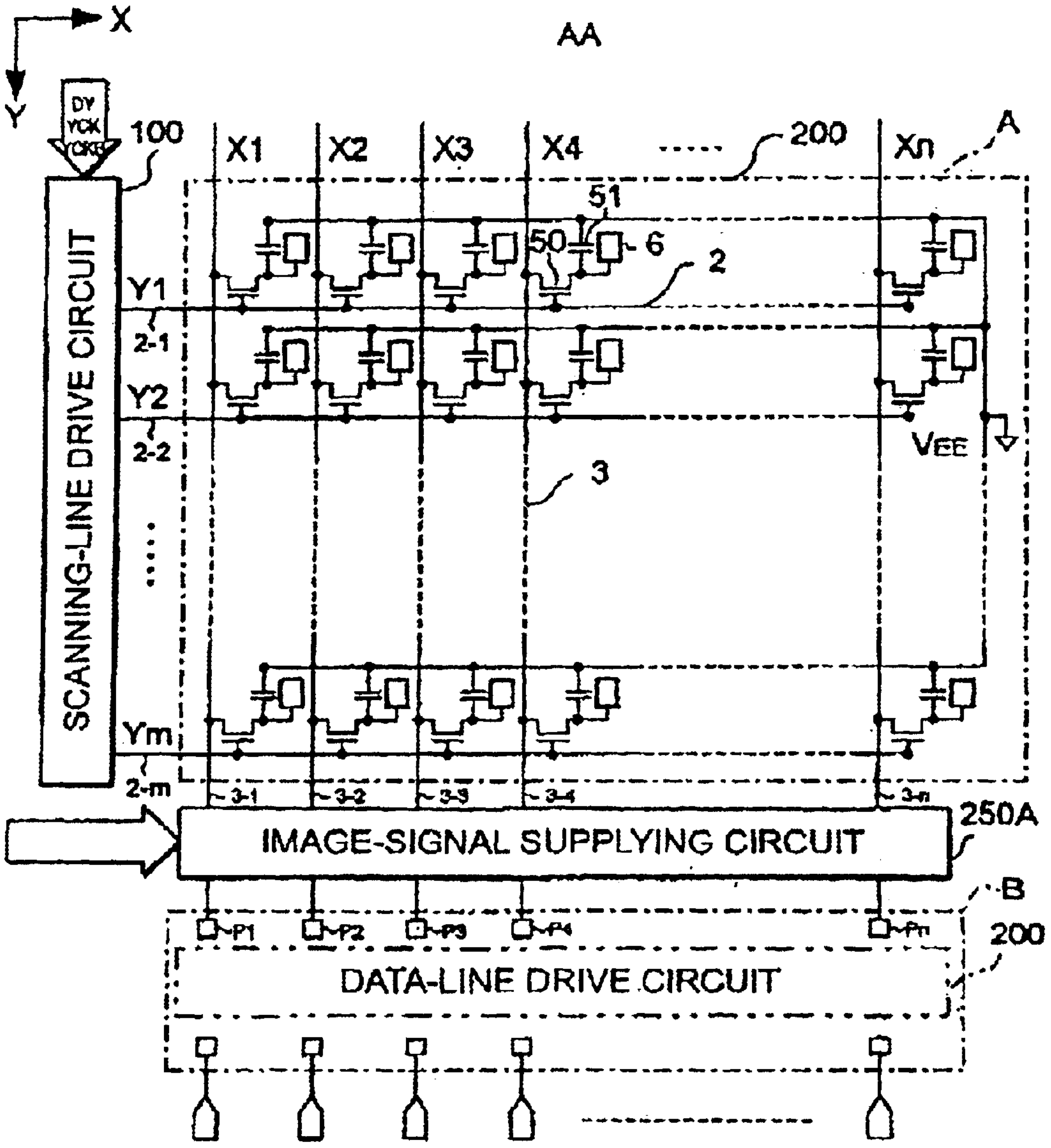
FIG. 1 is an exemplary block diagram showing the entire configuration of a liquid crystal panel AA according to a first embodiment of the present invention.

FIG. 1 is an exemplary block diagram showing the configuration of the liquid crystal panel AA. The liquid crystal panel AA includes an image display region A, a COG region B, a scanning-line drive circuit 100, and an image-signal supplying circuit 250A. A data-line drive circuit 200 (data-line driver IC), which will be described below, is fixed in the COG region B by using a COG technique.

In the image display region A, m scanning lines 2 (m is a natural number which is 2 or more) are arranged in parallel along the X-direction, and n data lines 3 (n is a natural number which is 2 or more) are arranged in parallel along the Y-direction. Hereinafter, numerical subscripts 1 to m will be added in order to distinguish each scanning line, and it will be referred to just as the scanning line 2 when the scanning lines are not distinguished from each other. Likewise, numerical subscripts 1 to n will be added in order to distinguish each data line, and it will be referred to just as the data line 3 when the data lines are not distinguished from each other.

At the vicinity of the intersection of the scanning line 2 and the data line 3, the gate of a TFT 50 is connected to the scanning line 2, the source of the TFT 50 is connected to the data line 3, and the drain of the TFT 50 is connected to a pixel electrode 6. Each pixel includes the pixel electrode 6, an opposing electrode (described later) formed on the opposing substrate, and liquid crystal sandwiched by these electrodes. As a result, pixels are arranged in a matrix pattern corresponding to the intersections of the scanning lines 2 and the data lines 3.

Also, pulsed scanning signals Y1, Y2, . . . , and Ym are line-sequentially applied to the scanning lines 2 respectively, to which the gate of the TFT 50 is connected. Accordingly, when the scanning signal is supplied to the scanning line 2, the TFT 50 connected to the scanning line 2 is turned on. Thus, data-line signals X1, X2, . . . , and Xn, which are supplied through the data lines 3 at a predetermined timing, are sequentially written in the corresponding pixel so as to be held for a predetermined period.

Since the alignment and order of liquid crystal molecules change in accordance with a voltage level which is applied to each pixel, gray shading can be realized by using optical modulation. For example, the amount of light passing through the liquid crystal is limited as the applied voltage becomes higher in a normally-white mode. On the other hand, the light amount limit is alleviated as the applied voltage becomes higher in a normally-black mode. Therefore, in the entire liquid crystal device, light having a contrast according to an image signal is radiated in each pixel. As a result, a predetermined display can be performed.

In order to prevent the held image signal from leaking, a holding capacitance 51 is provided in parallel with a liquid crystal capacitance formed between the pixel electrode 6 and the opposing electrode. For example, the voltage of the pixel electrode 6 is held by the holding capacitance 51 during a period which is a thousand times longer than the period when a source voltage is applied. Accordingly, a holding characteristic is improved and thus high contrast can be realized.

The scanning-line drive circuit 100 can include a shift register so that a Y-clock signal YCK, an inverted Y-clock signal YCKB, and Y-transfer-starting pulses DY are externally supplied thereto. The scanning-line drive circuit 100 sequentially transfers the Y-transfer-starting pulses DY by using the Y-clock signal YCK and the inverted Y-clock signal YCKB, so as to generate the scanning signals Y1, Y2, . . . , and Ym.

The image-signal supplying circuit 250A is used for inspecting the liquid crystal panel AA for display defects in a state that the data-line drive circuit 200 is not fixed to the COG region B. The image-signal supplying circuit 250A is connected to the data lines 3-1, 3-2, . . . , and 3-n, and is also connected to connection terminals P1, P2, . . . , and Pn for connecting the data-line drive circuit 200.

Also, the data-line drive circuit 200 can include a shift register, a sampling circuit, and an image-signal supplying line. The shift register sequentially generates n sampling signals which synchronize to an externally-supplied X-clock signal XCK so as to be activated. Also, the sampling circuit includes switches formed by TFTs, the number of switches being n, performs sampling of the image signal which is externally supplied through the image-signal supplying line, so as to generate the data-line signals X1 to Xn.

Figure 2:
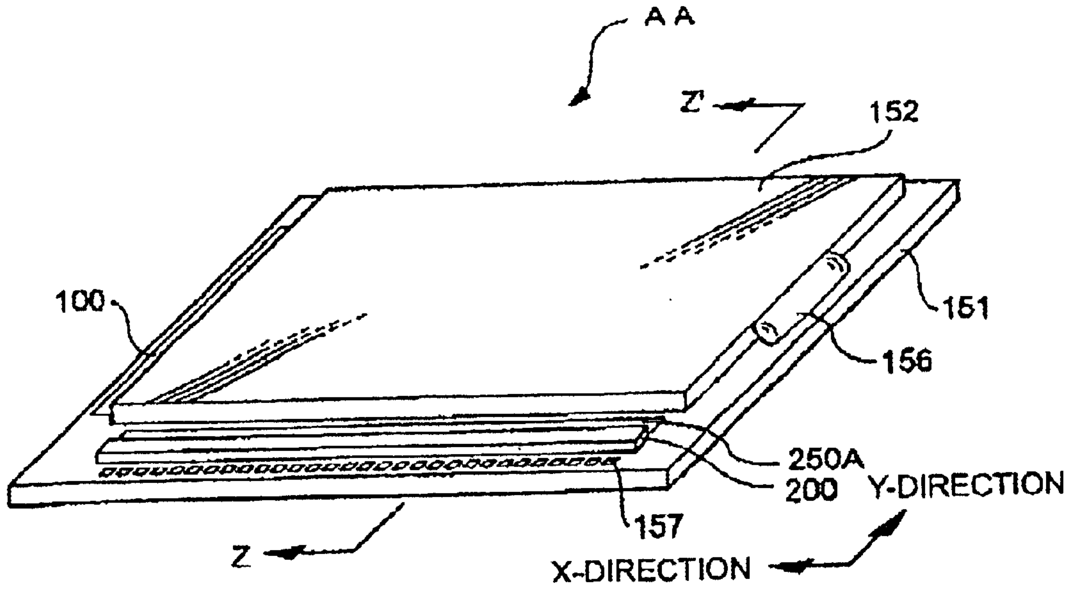
FIG. 2 is a perspective view illustrating the configuration of the liquid crystal panel AA.
Figure 3:
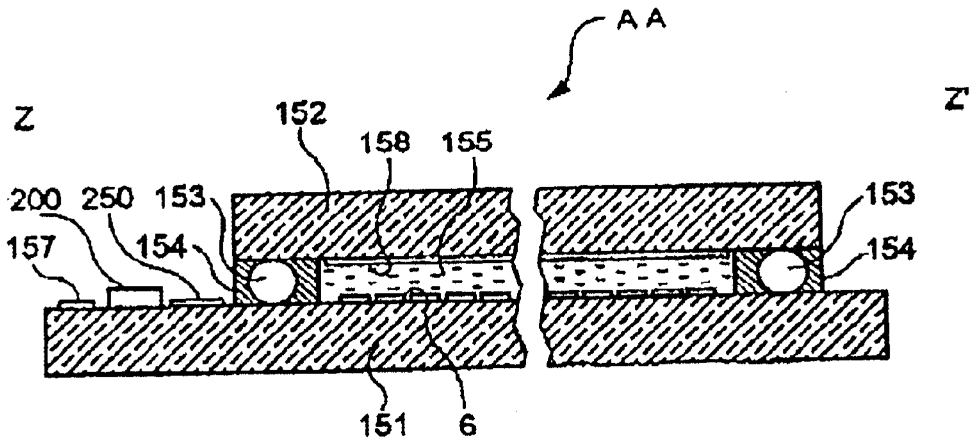
FIG. 3 is a cross-sectional view showing a part of the configuration of the liquid crystal panel AA.

Now, the mechanical configuration of the above-described liquid crystal panel will be described with reference to FIGS. 2 and 3. FIG. 2 is a perspective view showing the configuration of the liquid crystal panel AA and FIG. 3 is a cross-sectional view taken along the line Z-Z' in FIG. 2.

As shown in these figures, the liquid crystal panel AA includes the element substrate 151 which can include glass or semiconductor and which is provided with the pixel electrodes 6 and so on and the transparent opposing substrate 152 which can include glass or the like and which is provided with a common electrode 158. The element substrate 151 and the opposing substrate 152 are bonded to each other such that the electrode-formed surfaces thereof face each other, a predetermined space being formed therebetween by a sealing member 154 including a spacer 153. Further, liquid crystal 155, which is an electro-optical material, is sealed in this space. The sealing member 154 is formed along the periphery of the opposing substrate 152, but is opened at a portion so that the liquid crystal 155 can be inserted therethrough. Therefore, the opening is sealed by a seal 156 after the liquid crystal 155 has been filled in the space.

The above-described image-signal supplying circuit 250A is formed on the upper surface of the element substrate 151 and along an outer edge of the sealing member 154. Also, the data-line drive circuit 200 is fixed near the image-signal supplying circuit 250A so as to drive the data lines 3 extending in the Y-direction. Further, a plurality of connecting electrodes 157 are formed along the edge so as to receive various signals from a timing generating circuit 300, which will be described below, and image signals 40R, 40G, and 40B. Also, the scanning-line drive circuit 100 is formed along another edge so as to drive the scanning lines 2 extending in the X-direction.

The common electrode 158 of the opposing substrate 152 is electrically connected to the element substrate 151 through a conductive member which is provided at least one of the four corners of the common electrode 158 at the part bonded to the element substrate 151. Further, the opposing substrate 152 is provided with the following depending on the use of the liquid crystal panel AA: first, color filters arranged in a stripe-pattern, a mosaic-pattern, or a triangle-pattern; second, a black matrix of a resin black formed by dispersing a metallic material, such as chromium or nickel, carbon, and titanium in a photoresist; and third, a backlight for radiating light to the liquid crystal panel AA. In particular, for the use of color-light modulation, the color filters are not formed and a black matrix is provided on the opposing substrate 152.

In addition, an alignment layer which has been rubbed in a predetermined direction is provided on the opposed surfaces of the element substrate 151 and the opposing substrate 152. On the other hand, a polarizer (not shown) corresponding to the alignment direction is provided on each of the back surfaces of the substrates. However, when polymer dispersed liquid crystal, in which particles are dispersed in polymer, is used as the liquid crystal 155, the above-described alignment layers and polarizers are not necessary and thus light usage efficiency is increased. This is advantageous for increasing brightness and reducing power consumption.

Figure 4:
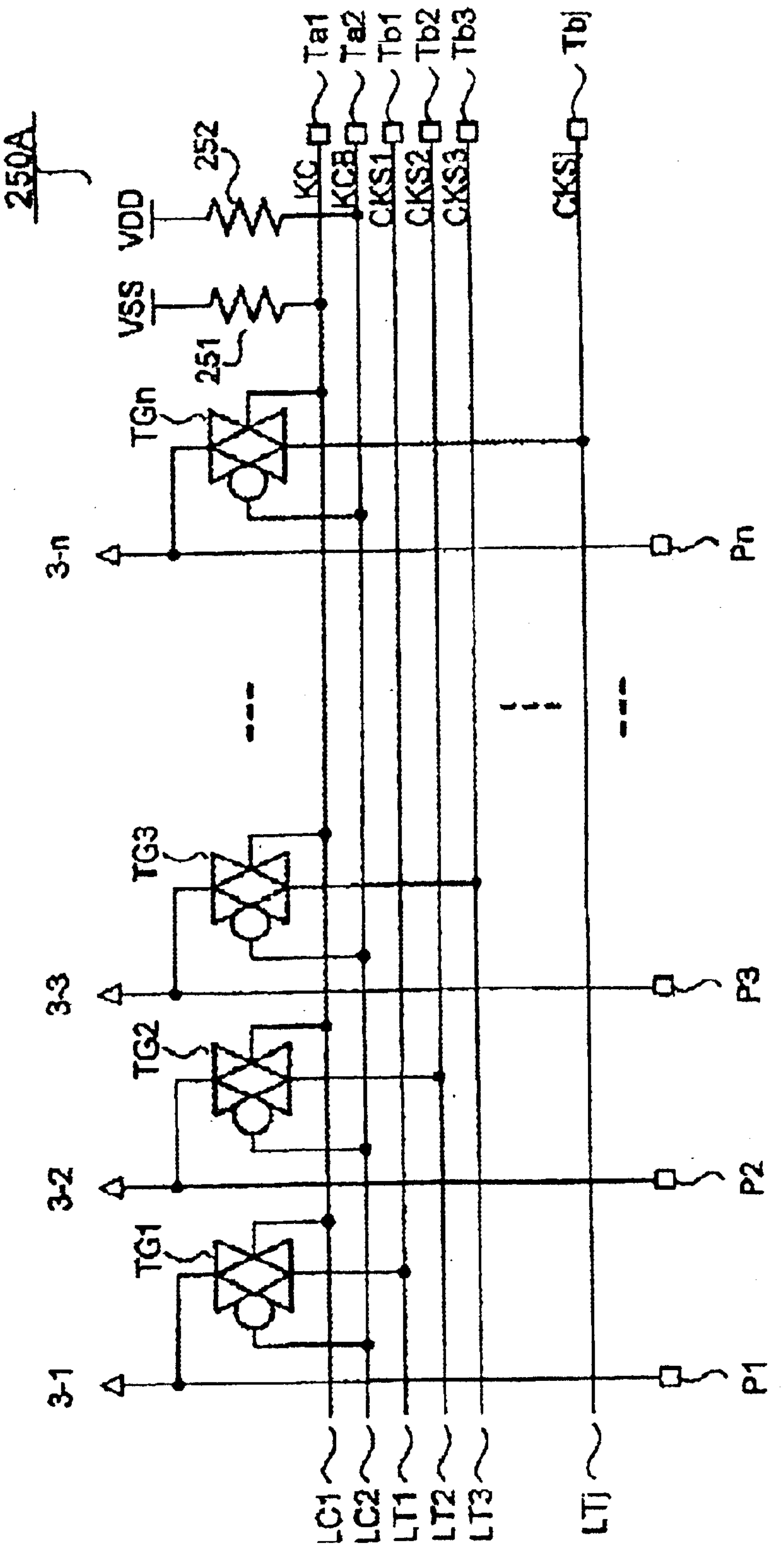
FIG. 4 is an exemplary circuit diagram showing an image-signal supplying circuit 250A used in the liquid crystal panel AA.

Next, an example of the configuration of the image-signal supplying circuit 250A will be described with reference to FIG. 4. The image-signal supplying circuit 250A includes transfer gates TG1 to TGn, two control lines LC1 and LC2, image-signal lines LT1 to LTj, a pull-down resistor 251, and a pull-up resistor 252. Herein, j is an even number lower than n.

The ends of the control lines LC1 and LC2 are connected to external connection terminals Ta1 and Ta2, respectively, and an inspection control signal KC and an inverted inspection control signal KCB are supplied from an inspection device (not shown) to the external connection terminals Ta1 and Ta2, respectively. The inspection control signal KC becomes active at a high level so as to operate the image-signal supplying circuit 250A. The inverted inspection control signal KCB is generated by inverting the inspection control signal KC.

The ends of the image-signal lines LT1 to LTj are connected to external connection terminals Tb1 to Tbj, respectively. Inspection signals CKS1 to CKSj are supplied from the inspection device to the external connection terminals Tb1 to Tbj, respectively. The input/output terminals of the transfer gates TG1 to TGn are connected to the data lines 3-1 to 3-n and to the connection terminals P1 to Pn.

In order to inspect the liquid crystal panel AA, the inspection control signal KC, the inverted inspection control signal KCB, and the inspection signals CKS1 to CKSj are supplied from the inspection device. When the inspection control signal KC and the inverted inspection control signal KCB are active, the transfer gates TG1 to TGn are turned on so that the inspection signals CKS1 to CKSj are supplied to the data lines 3-1 to 3-n. Therefore, by sequentially scanning the scanning lines 2 by using the scanning-line drive circuit 100, voltage according to the signal level of the inspection signals CKS1 to CKSj is written in the liquid crystal capacitance and the holding capacitance 51 of each pixel through the data lines 3-1 to 3-n. Accordingly, the liquid crystal panel AA can be inspected for display defects.

On the other hand, when the liquid crystal panel AA is determined to be a non-defective item, the data-line drive circuit 200 is fixed in the COG region B of the liquid crystal panel AA. In this case, since the external connection terminals Ta1, Ta2, and Tb1 to Tbj are disconnected from the inspection device, low-level and high-level voltage is supplied to each of the transfer gates TG1 to TGn through the pull-down resistor 251 and the pull-up resister 252. As a result, each of the transfer gates TG1 to TGn is turned off. In this state, the data lines 3-1 to 3-n are merely in connection with the connection terminals P1 to Pn through each wiring and are disconnected from the image-signal lines LT1 to LTj. Accordingly, the data-line drive circuit 200 can supply the data-line signals X1 to Xn to the data lines 3-1 to 3-n, respectively, without being affected by the image-signal supplying circuit 250A.

According to the image-signal supplying circuit 250A, the liquid crystal panel AA can be inspected for display defects before fixing the data-line drive circuit 200 to the liquid crystal panel AA. In addition, in a state where the data-line drive circuit 200 is fixed to the liquid crystal panel AA, gray shading can be performed without having any effect on the data lines 3-1 to 3-n. Further, the number of image-signal lines LT1 to LTj can be decreased to less than the number of data lines 3. Thus, even if the pitch of the data lines 3 is small, the size of the external connection terminals Th1 to Tbj can be increased so as to be stably contacted by using a jig, such as a probe. Accordingly, the liquid crystal panel AA can be determined to be acceptable or defective before fixing the data-line drive circuit 200 to the liquid crystal panel AA, and thus the cost for the liquid crystal panel AA can be significantly reduced.

The inspection for display defects can be performed by taking image data into a computer by using a CCD camera and executing an inspection program, and also can be performed visually.

The display defects include the following cases: malfunction in the gray shading of a pixel due to a defective TFT 50 forming the pixel, that is, a defective pixel is generated; malfunction in the gray shading of a vertical line due to a defective data line 3; and malfunction in the gray shading of a horizontal line due to a defective scanning line 2. In order to visually find such display defects, it is preferable to display various display patterns so as to attract the attention of an inspector. The display patterns include solid display, vertical stripe, horizontal stripe, and grid-pattern display.

Herein, the number j of image-signal lines must be an even number in order to display a vertical stripe. By setting the number j at an even number, different signals can be supplied to adjoining data lines 3 so that the gray shading of adjoining pixels can be different from each other.

For example, when j=2, a black and white vertical stripe is displayed by setting the signal level of the inspection signal CKS1 to white and by setting the signal level of the inspection signal CKS2 to black. Accordingly, the liquid crystal panel AA can be visually inspected for display defects.

Also, for example, the liquid crystal panel AA corresponds to color display, in which color filters are formed in a vertical stripe pattern and a pixel includes sub-pixels for displaying R, G, and B. In this case, when j=6, a pixel can be displayed in white and an adjoining pixel can be displayed in black by setting the signal level of the inspection signals CKS1 to CKS3 to white and by setting the signal level of the inspection signals CKS4 to CKS6 to black. Also, by setting the signal level of the inspection signals CKS1 and CKS4 to white and by setting the signal level of the other inspection signals to black, a monochrome stripe display can be realized. Further, by changing groups of inspection signals whose signal level is white in the order of CKS1 and CKS4, CKS2 and CKS5, and CKS3 and CKS6, a stripe of each color can be displayed.

Figure 5:
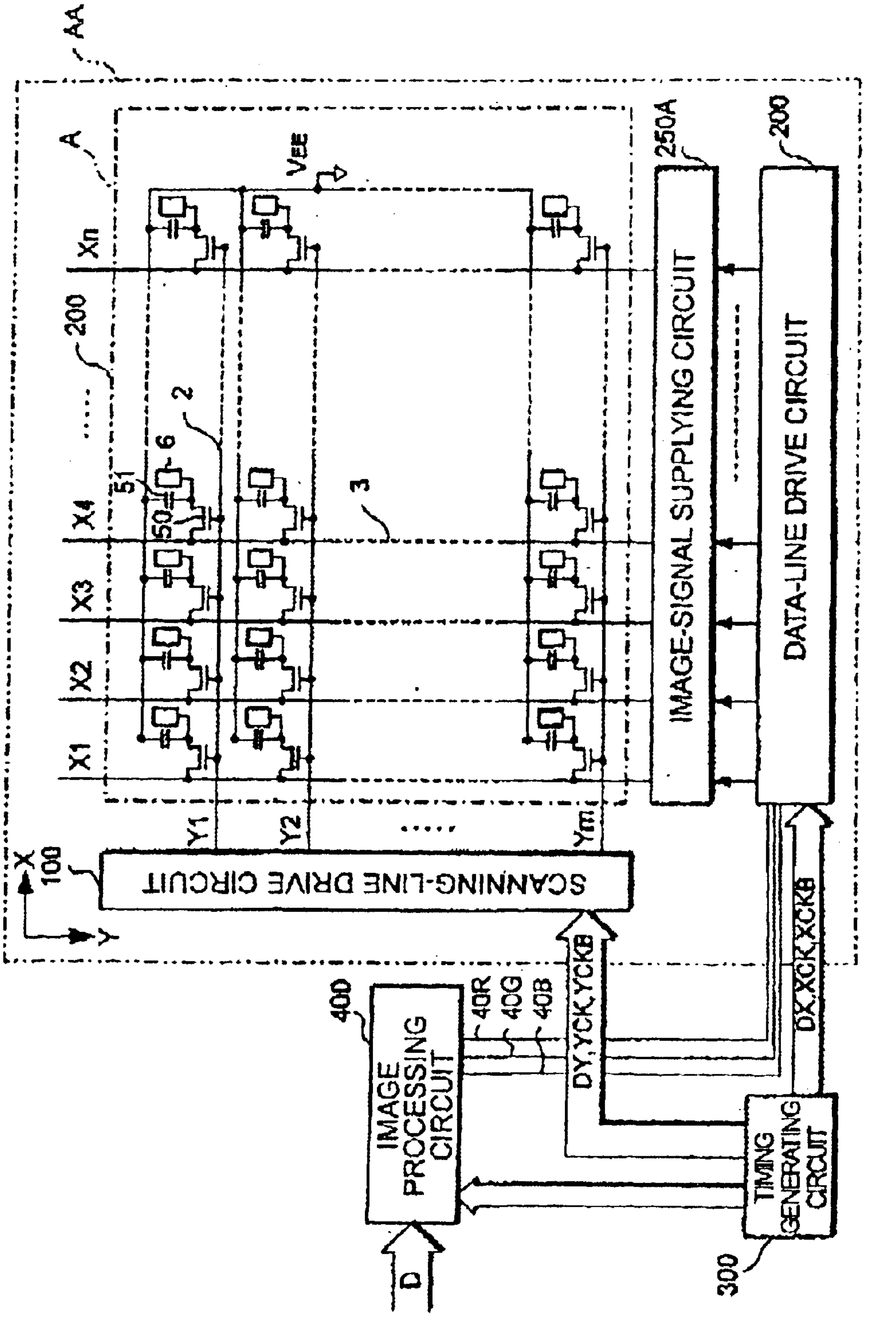
FIG. 5 is an exemplary block diagram showing the entire configuration of a liquid crystal device using the liquid crystal panel AA.

Next, a liquid crystal device using the above-described liquid crystal panel AA will be described. FIG. 5 is an exemplary block diagram showing the entire configuration of a liquid crystal device according to this embodiment. The liquid crystal device includes a timing generating circuit 300 and an image processing circuit 400, in addition to the above-described liquid crystal panel AA.

Input image data D which is supplied to this liquid crystal device is, for example, in a form of 3-bit parallel. The timing generating circuit 300 synchronizes to the input image data D so as to generate a Y-clock signal YCK, an inverted Y-clock signal YCKB, an X-clock signal XCK, an inverted X-clock signal XCKB, a Y-transfer-starting pulse DY, and an X-transfer-starting pulse DX. Then, the timing generating circuit 300 supplies them to the scanning-line drive circuit 100 and the data-line drive circuit 200. Also, the timing generating circuit 300 generates various timing signals for controlling the image processing circuit 400 and outputs the signals.

Herein, the Y-clock signal YCK specifies a period for selecting a scanning line 2, and the inverted Y-clock signal YCKB is generated by inverting the logic level of the Y-clock signal YCK. The X-clock signal XCK specifies a period for selecting a data line 3 and the inverted X-clock signal XCKB is generated by inverting the logic level of the X-clock signal XCK Also, the Y-transfer-starting pulse DY instructs start of selecting a scanning line 2 and the X-transfer-starting pulse DX instructs start of selecting a data line 3.

The image processing circuit 400 performs gamma correction and so on to the input image data D, considering the light-transmission characteristic of the liquid crystal panel, and then D/A-converts the image data of RGB, so as to generate image signals 40R, 40G, and 40B and to supply them to the liquid crystal panel AA.

A liquid crystal panel AA and a liquid crystal device according to a second embodiment are the same as those in the first embodiment except in that an image-signal supplying circuit 250B is used instead of the image-signal supplying circuit 250A, that the number of data lines 3 is k (k=3*n*), and that the image processing circuit 400 supplies an image signal 40 in which each of RGB is time-division multiplexed. Also, the liquid crystal panel AA of this embodiment corresponds to color display. Thus, the color filters are formed in a vertical stripe pattern and a pixel includes sub-pixels displaying R, G, and B. The vertical lines of 1st, 4th, . . . , and 3*n*-2nd from the left display R, the vertical lines of 2nd, 5th, . . . , and 3*n*-1st from the left display G, and the vertical lines of 3rd, 6th, . . . , and 3*n*th from the left display B.

Figure 6:
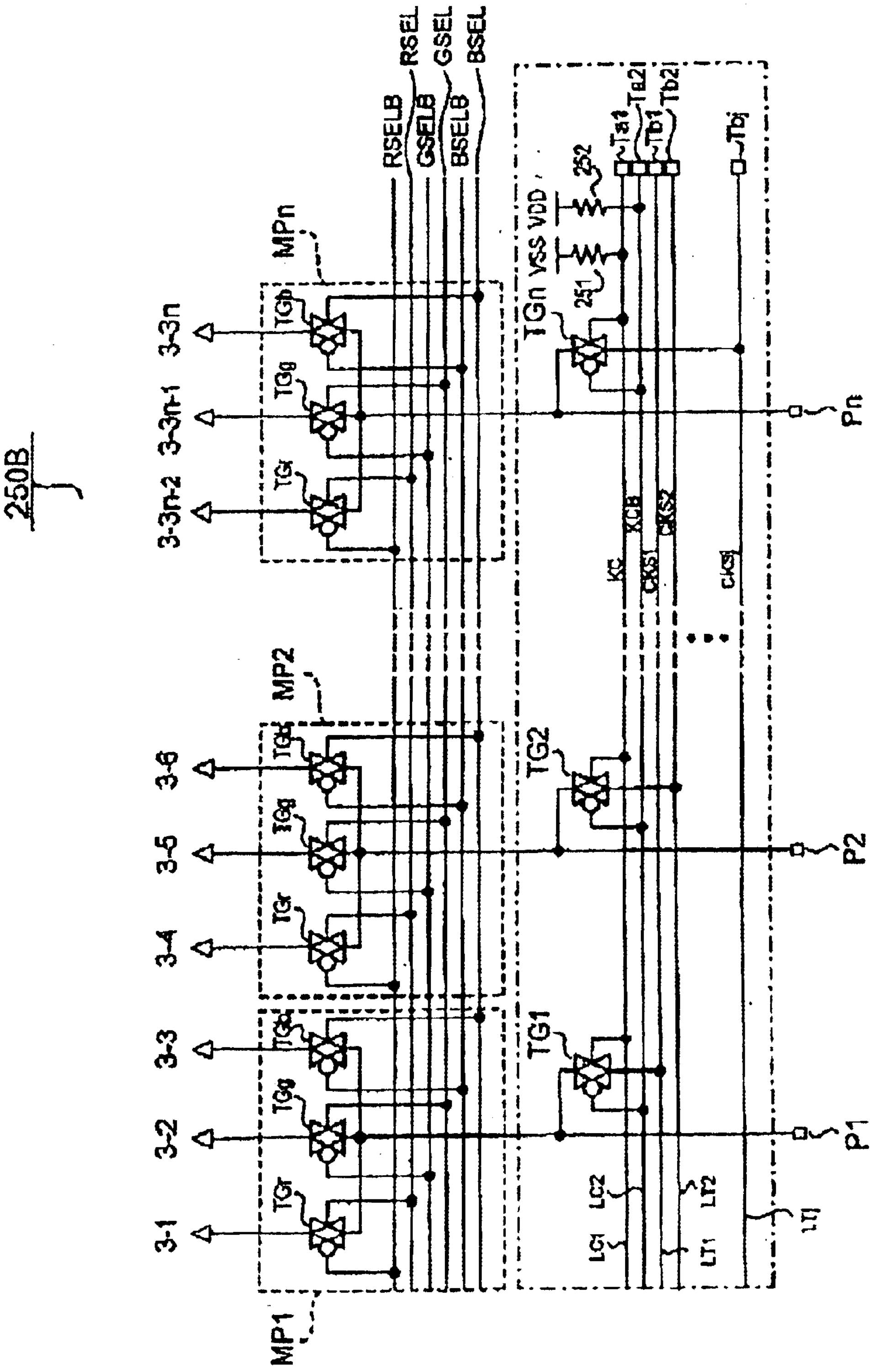
FIG. 6 is an exemplary circuit diagram showing an image-signal supplying circuit 250B used in a liquid crystal panel AA according to a second embodiment of the present invention.

FIG. 6 is an exemplary circuit diagram showing the image-signal supplying circuit 250B. In this image-signal supplying circuit 250B, regions surrounded by dotted lines are formed in the same way as in the image-signal supplying circuit 250A of the first embodiment. Therefore, in this embodiment, too, j is an even number which is smaller than n. Also, the image-signal supplying circuit 250B includes n-group of multiplexers MPI to MPn and control-signal lines L1 to L6.

Selection signals RSEL, GSEL, and BSEL and inverted selection signals RSELB, GSELB, and BSELB are supplied to the control-signal lines L1 to L6.

Each of the multiplexers MPI to MPn includes three transfer gates TGr, TGg, and TGb. Each of the transfer gates TGr, TGg, and TGb is turned on when the selection signals RSEL, GSEL, and BSEL are at a high level (active) and when the inverted selection signals RSELB, GSELB, and BSELB are at a low level (active), and is turned off when the selection signals RSEL, GSEL, and BSEL are at a low level and when the inverted selection signals RSELB, GSELB, and BSELB are at a high level.

In the above-described configuration, when the liquid crystal panel AA is inspected, the inspection device supplies the inspection control signal KC, the inverted inspection control signal KCB, the inspection signals CKS1 to CKSj, the selection signals RSEL, GSEL, and BSEL, and the inverted selection signals RSELB, GSELB, and BSELB. When the inspection control signal KC and the inverted inspection control signal KCB are active, the transfer gates TG1 to TGn are turned on. Then, by adequately setting the logic level of the selection signals and the inverted selection signals, the inspection signals CKS1 to CKSj are supplied to the data lines 3-1 to 3-n. Therefore, by sequentially scanning the scanning lines 2 by using the scanning-line drive circuit 100, voltage according to the signal level of the inspection signals CKS1 to CKSj is written in the liquid crystal capacitance and the holding capacitance 51 of each pixel through the data lines 3-1 to 3-n, respectively. Accordingly, the liquid crystal panel AA can be inspected for display defects.

For example, when j=2, a black and white vertical stripe can be displayed by setting the signal level of the inspection signal CKS1 to white and the signal level of the inspection signal CKS2 to black, and by setting the selection signals RSEL, GSEL, and BSEL to a high level and the inverted selection signals RSELB, GSELB, and BSELB to a low level. In this way, the liquid crystal panel AA can be visually inspected for display defects.

Also, by setting the selection signal RSEL to a high level and by setting the inverted selection signal RSELB to a low level so as to turn on only the transfer gate TGr, R-color can be displayed in the vertical lines of 1st, 4th, and 3*n*-2nd from the left so that a single-color inspection can be performed.

In the above-described embodiments, the element substrate 151 of the liquid crystal panel can include a transparent insulative substrate, such as glass. Also, a silicon thin-film is formed on the substrate, and a source, drain, and channel are formed on the thin-film so as to form a TFT. By using the TFT, a switching element (TFT 50) of a pixel and the element of the data-line drive circuit 200 and the scanning-line drive circuit 100 are formed. However, the present invention is not limited to this configuration.

For example, the element substrate 151 may include a semiconductor substrate and insulative gate-type field-effect transistors, in which a source, drain, and channel are formed, may be formed on the surface of the semiconductor substrate so that the field-effect transistors serve as switching elements of pixels and elements of various circuits. When the element substrate 151 is formed by using a semiconductor substrate, the element substrate 151 cannot be used as a transmissive display panel, and thus is used as a reflective display panel by forming the pixel electrode 6 with aluminum or the like. Alternatively, the element substrate 151 may be transparent and the pixel electrode 6 may be reflective.

In the above-described embodiments, the switching element of a pixel is a three-terminal element, such as a TFT. However, the switching element may be formed by a two-terminal element such as a diode. However, when a two-terminal element is used as the switching element of a pixel, the scanning lines 2 must be formed on one substrate and the data lines 3 must be formed on the other substrate. Also, the two-terminal element must be formed between one of the scanning line 2 and the data line 3 and the pixel electrode. In this case, a pixel includes the two-terminal element which is connected between the scanning line 2 and the data line 3 in series and liquid crystal.

In this specification, an active matrix liquid crystal display device has been described. However, the present invention can be applied to a passive matrix liquid crystal display device using super twisted nematic (STN) liquid crystal. Also, an electroluminescence element may be used as an electro-optical material instead of liquid crystal so as to perform display by using the electro-optical effect thereof. That is, the present invention can be applied to various types of electro-optical devices having a similar configuration as that of the above-described liquid crystal device.

Next, a case where the above-described liquid crystal device is applied to various electronic apparatuses will be described.

Figure 7:
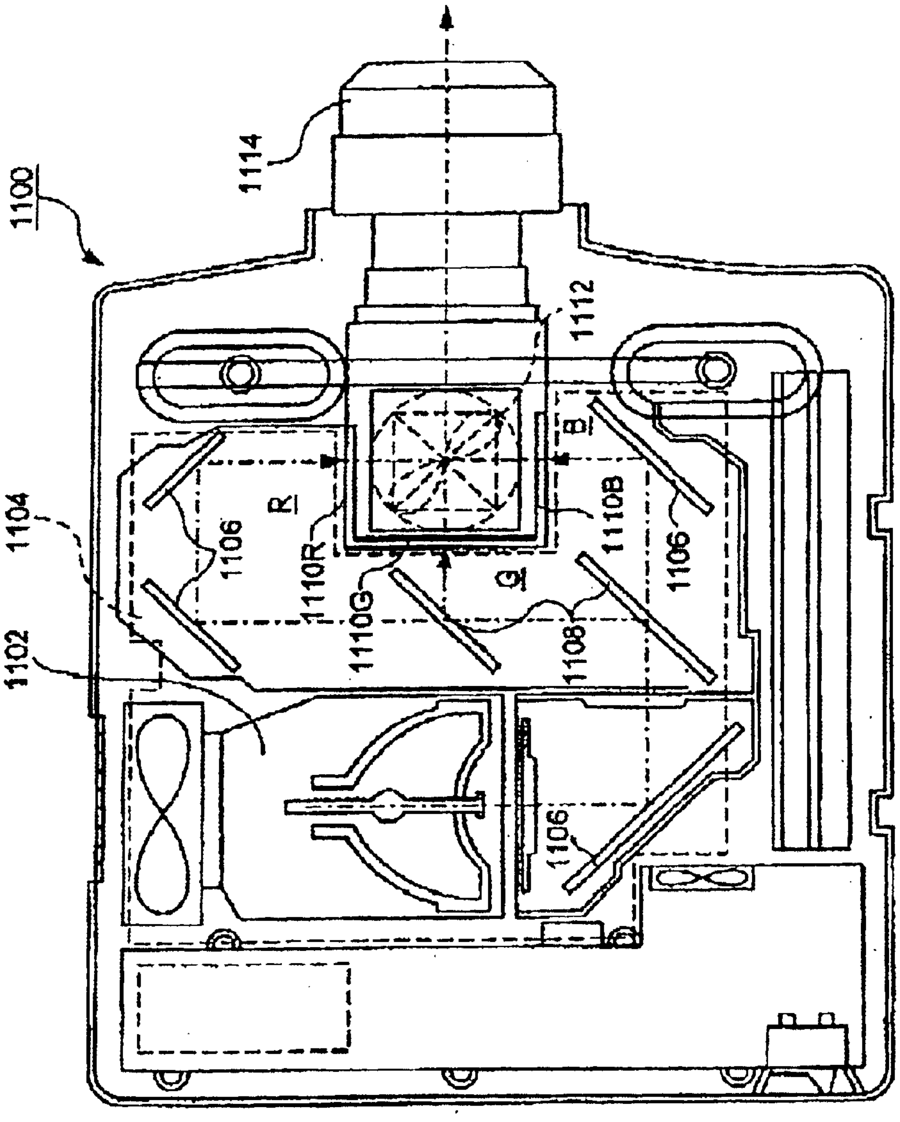
FIG. 7 is a cross-sectional view showing a video projector, which is an example of electronic apparatuses using the liquid crystal panel.

First, a projector using this liquid crystal device as a light valve will be described. FIG. 7 is a plane view showing an example of the configuration of the projector.

As shown in FIG. 7, a lamp unit 1102 including a white light source, such as a halogen lamp, is provided inside the projector 1100. Light projected from this lamp unit 1102 is divided into RGB by four mirrors 1106 and two dichroic mirrors 1108 provided in a light guide 1104, and the divided light rays enter liquid crystal panels 1110R, 1110G, and 1110B serving as light valves corresponding to the three colors.

The configuration of each of the liquid crystal panels 1110R, 1110G, and 1110B is the same as that of the above-described liquid crystal panel AA, and is driven by R, G, or B signal supplied from an image-signal processing circuit (not shown). Then, the light rays which have been modulated by these liquid crystal panels enter a dichroic prism 1112 from three directions. In the dichroic prism 1112, the R-light ray and the B-light ray are refracted by 90°, while the G-light ray goes straight. Accordingly, images of RGB colors are synthesized, and thus a color image is projected on a screen or the like through a projection lens 1114.

In the display images of the liquid crystal panels 1110R, 1110G, and 1110B, the display image generated by the liquid crystal panel 1110G must be laterally inverted with respect to the display images generated by the liquid crystal panels 1110R and 1110B.

Since light rays corresponding to RGB enter the liquid crystal panels 1110R, 1110G, and 1110B through the dichroic mirror 1108, color filters need not be provided.

Figure 8:
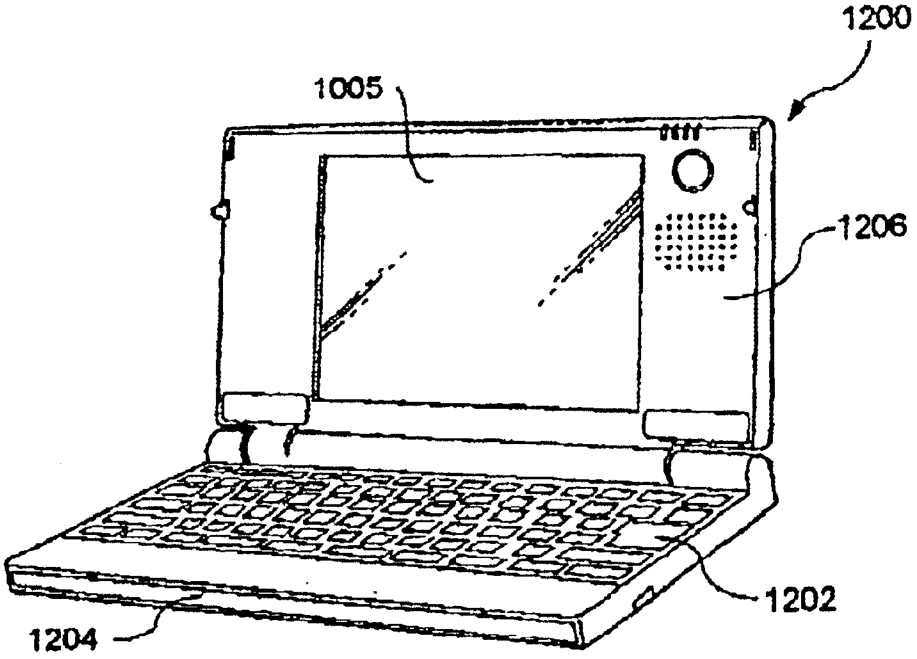
FIG. 8 is a perspective view showing the configuration of a personal computer, which is an example of electronic apparatuses using the liquid crystal panel.

Next, a case where the liquid crystal panel is applied to a mobile personal computer will be described. FIG. 8 is a perspective view showing the configuration of the personal computer. In FIG. 8, a computer 1200 includes a main body 1204 having a keyboard 1202 and a liquid crystal display unit 1206. This liquid crystal display unit 1206 is formed by attaching a backlight at the back side of the above-described liquid crystal panel 1005.

Figure 9:
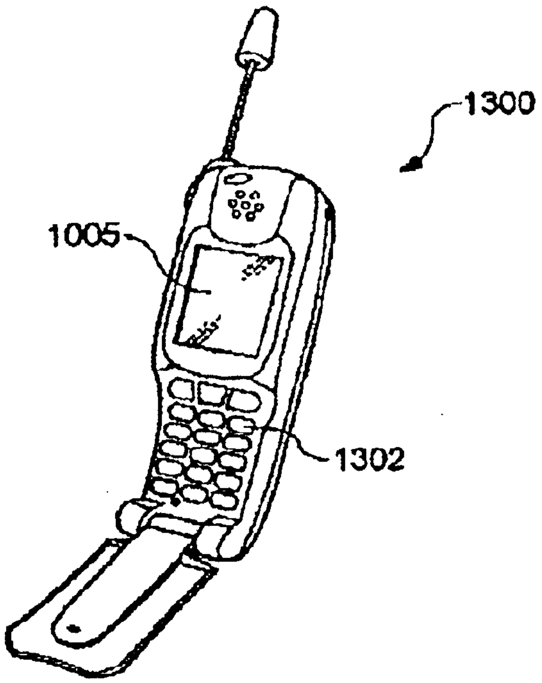
FIG. 9 is a perspective view showing the configuration of a mobile phone, which is an example of electronic apparatuses using the liquid crystal panel.
Figure 10:
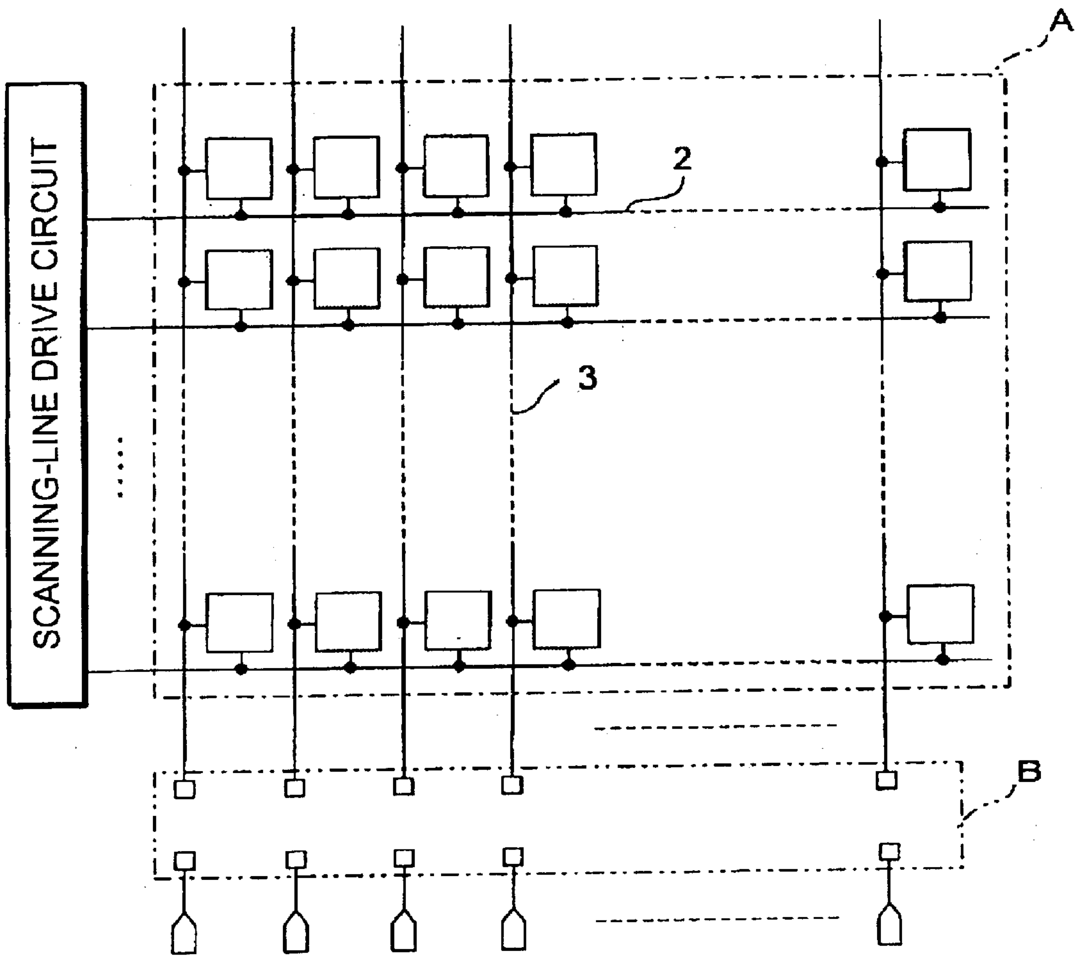
RELATED ART FIG. 10
FIG. 10 is an exemplary block diagram showing the configuration of a known liquid crystal panel.

Further, a case where the liquid crystal panel is applied to a mobile phone will be described. FIG. 9 is a perspective view showing the configuration of the mobile phone. In FIG. 9, the mobile phone 1300 includes a plurality of operation buttons 1302 and a reflective liquid crystal panel 1005. If necessary, a front light is provided on the front surface of the reflective liquid crystal panel 1005.

Of course, the liquid crystal panel can be applied to various electronic apparatuses such as liquid crystal television sets, video-tape recorders of a view-finder type or a monitor direct-view type, car navigation systems, pagers, electronic notepads, electronic calculators, word processors, work stations, videophones, POS terminals and apparatuses including a touch panel, as well as the electronic apparatuses described with reference to FIGS. 8 and 9.

As described above, according to the present invention, inspection for display defects can be performed before mounting a data-line driver IC even when the pitch of pixels is small. Further, when each data line is driven by mounting the data-line driver IC, the image-signal supplying circuit does not have any effect on the drive of the data lines.

What is claimed is:

1. An image-signal supplying circuit which can inspect an electro-optical panel including a plurality of scanning lines, a plurality of data lines, and switching elements arranged in a matrix pattern corresponding to intersections of the scanning lines and the data lines, the image-signal supplying circuit comprising:

wires that connect connection terminals of a data-line driver IC that drive the data lines;

image-signal lines whose number is smaller than that of the data lines;

a connection circuit that connects or disconnects each of the wires and each of the image-signal lines based on a control signal, the connection circuit being provided for each of the wires; and control lines that connect an external connection terminal to which the control signal is supplied and the connection circuits.

2. An image-signal supplying circuit which can inspect an electro-optical panel including a plurality of scanning lines, a plurality of data lines whose number is men, wherein m and n are natural numbers which are 2 or more, and pixel electrodes and switching elements arranged in a matrix pattern corresponding to intersections of the scanning lines and the data lines, the image-signal supplying circuit comprising:

a selection circuit including multiplexers whose number is n, each multiplexer having an input terminal and output terminals whose number is m;

control lines that supply a selection signal to each of the multiplexers;

image-signal lines whose number is j, wherein j is a natural number which is 2 or more and is smaller than n;

wires that connect input terminals of the multiplexers and connection terminals of a data-line driver IC for driving the data lines;

a connection circuit that connects or disconnects each of the wires and each of the image-signal lines based on a control signal, the connection circuit being provided for each of the wires; and control lines that connect an external connection terminal to which the control signal is supplied and the connection circuits.

3. The image-signal supplying circuit according to claim 1, the connection circuit including a transfer gate which is switched on or switched off by the control signal.

4. The image-signal supplying circuit according to claim 3, further comprising a resistor which is connected between a power source line that supplies a voltage for switching off the transfer gate and the control line.

5. The image-signal supplying circuit according to claim 1, the number of said image-signal lines being an even number.

6. An electro-optical panel, comprising:

an electro-optical material;

a plurality of scanning lines;

data lines whose number is m·n, wherein m and n are natural numbers which are 2 or more;

switching elements arranged in a matrix pattern corresponding to intersections of the scanning lines and the data lines; and the image-signal supplying circuit according to claim 1.

7. The electro-optical panel according to claim 6, further comprising a region that provides a data-line driver IC which drives the data lines.

8. An electronic apparatus, comprising the electro-optical panel according to claim 6, in which a data-line driver IC is provided in a region.

* * * * *